(12) United States Patent
Chen (10) Patent No.: US 8,242,533 B2
(45) Date of Patent: Aug. 14, 2012

(54) LATERAL SCHOTTKY DIODE

(75) Inventor: Xingbi Chen, Chengdu (CN)

(73) Assignee: University of Electronic Science and Technology, Chengdu, Sichuan (CN)

( * ) Notice: Subject to any disclaimer, the term of this patent is extended or adjusted under 35 U.S.C. 154(b) by 520 days.

(21) Appl. No.: 12/536,726

(22) Filed: Aug. 6, 2009

(65) Prior Publication Data

US 2010/0244089 A1    Sep. 30, 2010

(30) Foreign Application Priority Data

Mar. 31, 2009  (CN) .......................... 2009 1 0131474

(51) Int. Cl.
*H01L 29/872*    (2006.01)
(52) U.S. Cl. .................................. 257/111; 257/E29.338
(58) Field of Classification Search .................. 257/111, 257/213, 288, 327, 335, 341, 342, E29.211, 257/E29.338, E27.017, E27.062
See application file for complete search history.

(56) References Cited

U.S. PATENT DOCUMENTS

| 5,726,469 A | 3/1998 | Chen |
| 6,310,365 B1 | 10/2001 | Chen |
| 6,998,681 B2 | 2/2006 | Chen |

*Primary Examiner* — Benjamin Sandvik
*Assistant Examiner* — Whitney T Moore
(74) *Attorney, Agent, or Firm* — Fish & Richardson P.C.

(57) ABSTRACT

High- and low-side surface voltage sustaining regions are produced utilizing optimum surface variation lateral doping. Schottky junctions are formed by depositing metal (M) on an n-type region having the lowest potential, taking M as the anode $A_L$ or $A_H$ of the Schottky diode, and ohmic contact is formed at the portion having the highest potential, taken as the cathode $K_L$ or $K_H$ of the Schottky diode. The potentials refer to a reverse bias applied to the Schottky diode. Each voltage-sustaining region is isolated and can be divided into several sections with isolation region inserted between them. A Schottky diode is formed in each section and connected to each other in series. A lateral Schottky diode and an n-MOST can be formed within a single voltage-sustaining region. The source region and drain region are connected directly to the anode and cathode of the Schottky junction, respectively.

8 Claims, 6 Drawing Sheets

LATERAL SCHOTTKY DIODE

FIELD OF THE INVENTION

This invention relates to high-voltage Schottky diode, and more particularly relates to lateral high-voltage Schottky diode.

BACKGROUND OF THE INVENTION

In references [1-3], methods of implementing high-reverse-voltage MOST by utilizing optimum surface variation lateral doping are provided. Using such methods, a lateral interdigitated semiconductor device is formed in a surface of a lightly doped substrate of a first semiconductor type, wherein it comprises at least one device which includes a region having the same potential with the substrate and a region with its voltage variable from zero to the largest reverse bias taking substrate as reference; it can also comprises other device(s) device, including a region having a voltage variable from zero to the largest reverse bias and a region with its voltage being the largest reverse bias taking substrate as reference. In the present invention, the surface region from the floating voltage region to the region in contact with the substrate is defined as a first surface voltage sustaining region, and the surface region from the largest reverse bias region to the floating voltage region is defined as a second surface voltage sustaining region. The two voltage sustaining regions are formed by superposition of thin layer(s) of a first conductivity type and thin layer(s) of a second conductivity type alternatively, wherein the thin layer contacted directly to the substrate is of a second conductivity type. Said thin layer of a second conductivity type contacted directly to the substrate is directly connected to the largest voltage portion in the voltage sustaining region and other thin semiconductor layers of a second conductivity type are connected to the largest voltage region via a region close to it, or are connected to it at the finger end of interdigitated layout. Each of the regions of a first conductivity type is connected to the smallest voltage region via a region close to it, or it is connected to the region at the finger end of interdigitated layout. When the first conductivity type is p-type, the largest voltage is positive. When the first conductivity type is n-type, the largest voltage is negative. Said total thickness of all thin layers should be less than the thickness of the depletion layer of a one-sided abrupt plane junction of the same substrate under the largest reverse bias. The amount of effectively ionized impurity per area of a second conductivity type in the thin layer of a second conductivity type contacted directly to the substrate in each surface voltage sustaining region can varies with distance, but should be not more is than $2D_0$, where $D_0$ is the impurity density of a second conductivity type in the depletion region of the heavily-doped side of a one-sided abrupt parallel-plane junction formed by the same substrate under the largest reverse bias. Besides, for the second surface voltage sustaining region, the impurity density of the thin layer of a second conductivity type in contact with substrate should be not less than $D_0$. In addition, the impurity density of the portion close to the largest voltage region in each layer of each voltage sustaining region should be not more than $2D_0$ and the impurity density of the region close to the lowest voltage region should be not more than $1.8D_0$.

Between the two surface voltage-sustaining regions, there is a carrier isolation region having the surface dimension much less than those of the two surface voltage sustaining regions.

The key point of optimum surface variation lateral doping technology is that, that the overall effective impurity of second conductivity type decreases gradually or stepwisely with the increase of the distance from the portion having the largest voltage in the voltage sustaining region, and approaches zero in the lowest voltage region. Where the overall effective impurity density of second conductivity type is defined as the value of the sum of the effective impurity density of all layers of a second conductivity type in a surface area subtracts the sum of the effective impurity density of all layers of first conductivity type in the same surface area, and then divided by the area. Wherein the surface area has dimensions in any direction being much smaller than the thickness of the depletion region of a one-sided abrupt parallel-plane junction made by the same substrate under the largest reverse bias.

Figure 1:
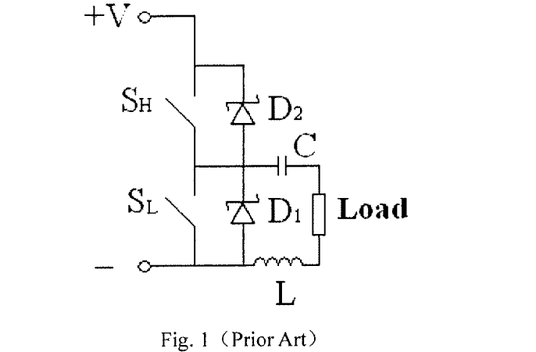
FIG. 1 schematically shows an application of high-voltage diode where the load can be a fluorescent lamp. (Prior art)

Based on Ref. [2 and 3], many power integrated circuits can be realized. FIG. 1 shows an application where the load is a fluorescent lamp. The switches of $S_H$ and $S_L$ and their drivers can all be realized according to Ref. [2 and 3]. In this figure, V is the voltage of the external power supply. When $S_H$ is switched on, the current flows from the positive terminal V, via $S_H$, capacitor C, the load, the inductance L, and finally reaches the negative terminal of the power supply illustrated as "−" in the figure. When $S_H$ is switched off, since the current through the inductance should be continuous, the C is being charged via the diode $D_1$. After a short duration, $S_L$ is switched on, then the capacitor C is discharged via $S_L$, L and the load. In the next stage that $S_L$ is switched off, the current flows from terminal "−", via L, the load, C, $D_2$ and finally reaches terminal "+V". It should be noted that diodes $D_1$ and $D_2$ must be high-voltage fast recover diode or high voltage Schottky diodes. So, if $S_H$ and $S_L$ are realized by using the method in [2 and 3], the two diodes must be connected externally, leading to a higher packaging cost at least.

SUMMARY OF THE INVENTION

A technical problem to be solved by the invention is to provide a semiconductor lateral device.

The present invention provides a semiconductor lateral device formed on a surface of a lightly-doped semiconductor substrate of a first conductivity type comprising one Schottky diode of a first type and/or one Schottky diode of a second type;

wherein said Schottky diode of a first type comprises at least a zero voltage region with the same potential as that of the substrate, a floating voltage region with a voltage variable from zero to the largest reverse bias voltage, and a first voltage sustaining region between said zero voltage region and said floating voltage region;

wherein said Schottky diode of a second type, comprises at least a floating voltage region of said Schottky diode of a second type with its voltage larger than or equal to that of the floating voltage region of said Schottky diode of a first type, a largest voltage region and a second voltage sustaining region in the surface between said floating voltage region of said Schottky diode of second type and said largest voltage region;

wherein said substrate is defined as having smallest voltage and is taken as the reference of potential; when the first conductivity type is p-type and the second conductivity type is n-type, the value of said largest voltage is positive, said floating voltage region and largest voltage region have positive potentials; when the first conductivity type is n-type and the second conductivity type is p-type, the value of said largest voltage is negative, said floating voltage region and largest voltage region have negative potentials, being lower than that zero potential of said substrate;

wherein each of said two voltage sustaining regions comprises:
at least an n-type semiconductor layer,
at least a layer of a second conductivity type contacted with the substrate
and layers of different conductivity types arranged alternatively starting from said substrate to semiconductor surface;

wherein in said voltage sustaining region, a cathode region of each of said Schottky diode is formed on top of a portion having the highest potential under a reverse bias; an anode region is formed on top of the portion having the lowest potential; said n-type semiconductor of said voltage sustaining region in both cathode region and anode region have two conductor layers be contacted with, said two conductor layers form cathode and anode of said Schottky diode; wherein said conductor on the portion having the lowest potential is metal, said metal and said n-type semiconductor region beneath said metal forms Schottky junction; said metal is the anode of the Schottky diode;

said Schottky junction has a current flow from said metal to said n-type semiconductor region beneath said metal, when a positive voltage is applied from said metal to said n-type semiconductor region, said current in said n-type semiconductor region is mainly due to a flow of electrons;

said semiconductor layer of second conductivity type in contact directly with the substrate is contacted to the region having the largest voltage in the voltage sustaining region, and other semiconductor layers of second conductivity type are connected to the region having the largest voltage through a part of semiconductor of second conductivity type close to it, or through said metal forming Schottky junction;

wherein each semiconductor layer of a first conductivity type is at least partly contacted directly to the region having the smallest voltage at finger edges or at the finger ends of the interdigitated layout;

wherein the overall thickness of said surface voltage sustaining region should be less than that of depletion region of a one-sided abrupt parallel-plane junction made by the same substrate under a reverse bias close to the breakdown voltage;

wherein the semiconductor layer of a second conductivity type in contact with the substrate is defined as the first layer; the density of the impurity of said first layer can varies with distance but should be not larger than $2D_0$; for the second surface voltage sustaining region, the density of impurity of said first layer should be not smaller than $D_0$; where the density of the impurity is defined as the amount of effectively ionized impurity of a second conductivity type per area in the layer, $D_0$ is the impurity density of a second conductivity type in the depletion region of the heavily-doped side of a one-sided abrupt parallel-plane junction made by the same substrate under the largest reverse bias;

wherein at place(s) close to the largest voltage region, the value of impurity density of each layer of each voltage sustaining region should be not larger than $2D_0$, and at place(s) close to the smallest voltage region, the value of the impurity density should be not larger than $1.8D_0$;

wherein the overall effective impurity density, being obtained by subtracting the sum of the effective impurity density of layers of a first conductivity type from the sum of the effective impurity density of layers of a second conductivity type, decreases gradually or stepwisely with the increase of the distance from the portion having the largest voltage in the voltage sustaining region, and approaches zero at the portion having the smallest voltage region;

wherein said impurity density is obtained by dividing the sum of the number of ionized impurity in a surface area, said surface area has dimensions in any direction much smaller than the thickness of the depletion region of a one-sided abrupt parallel-plane junction made by the same substrate under a largest reverse bias;

when the voltage of the largest voltage region approaches that of the smallest voltage region, except first layer of said voltage sustaining region, each layer has only a small part corresponding to the built-in potential being depleted.

According to an aspect of the present invention, an insulator layer is formed between the substrate and lateral interdigitated Schottky diode and/or between every two layers of the surface voltage sustaining region.

According to an aspect of the present invention, the semiconductor lateral device comprises at least one Schottky diode of a first type and at least one Schottky diode of a second type; wherein an insulator layer is formed between the first voltage sustaining region and the second voltage sustaining region.

According to an aspect of the present invention, the semiconductor lateral device comprises at least one Schottky diode of a first type and at least one Schottky diode of a second type; wherein an isolation region for carriers is located from said floating voltage region of said Schottky diode of first type to said floating voltage region of Schottky diode of second type; said isolation region for carriers has a surface distance, said distance is smaller than the thickness of the depletion region of a one-sided abrupt parallel-plane junction made by the same substrate under a largest reverse bias.

According to an aspect of the present invention, the voltage sustaining region(s) of Schottky diode of first type and/or second type is divided into at least two sections and an isolation region is inserted between two neighbouring sections;

wherein each section forms a sectional Schottky diode;

under a reverse bias applied across each section, a cathode region of a sectional Schottky diode is formed on top of the portion having the highest potential and an anode region of a sectional Schottky diode is formed on top of the portion having the lowest potential, wherein two conductor layers contacted to said n-type semiconductor layer at said anode region and at said cathode region, forming anode electrode and cathode electrode of a sectional Schottky diode;

wherein said conductor layer located at portion of lowest potential is a metal, said metal is anode and forming Schottky junction with portion of said n-type semiconductor layer beneath said metal;

wherein said conductor layer located at portion of highest potential is cathode;

said sectional Schottky diodes of one type Schottky diode are in a series connection according to a sequence before said division into sections of voltage sustaining region.

According to an aspect of the present invention, an isolation region between neighbouring surface voltage sustaining regions or neighbouring sections located from a larger voltage portion to a smaller voltage portion under a reverse bias is started from a semiconductor region of a second conductivity type, and then through a semiconductor region of a first conductivity type contacted with the substrate;

wherein in said isolation region, a thick insulator layer formed on top of said semiconductor region of a first conductivity type contacted with the substrate is permitted;

wherein a thin insulator layer formed on top of semiconductor region of a second conductivity type of said isolation region is permitted;

wherein a conductor with one part covering on said isolation layer and another part directly contacted to the top of said smaller voltage portion of surface voltage sustaining region or to the top of said smaller voltage portion of a section is permitted.

According to an aspect of the present invention, edges of said metal of said Schottky junction is contacted to p-type semiconductor.

According to an aspect of the present invention, the, Schottky diode of one type is connected in parallel with an n-MOST;

wherein Schottky junction is formed by depositing metal layer on top of some portions of n-type semiconductor region having the lowest potential said metal layer also covers directly on p-type semiconductor regions neighbouring to n-type semiconductor region and on n-type semiconductor region inside p-type regions;

wherein an insulator layer covers on other n-type semiconductor region neighbouring to said metal layer, said insulator layer extends to covering p-type semiconductor regions neighbouring to n-type semiconductor region except portions having metal layer, said insulator layer even extends to covering an n-type semiconductor region inside p-type regions;

said insulator layer forms a gate insulator layer of said n-MOST; a gate electrode of said n-MOST is formed by depositing a conductor on top of said insulator layer; said source electrode of said n-MOST is the metal part of the Schottky junction; a drain electrode of said n-MOST is said cathode of the Schottky diode.

It is well-known that a high voltage diode is a widely-used very important device. In present invention, a method of integrating high voltage diode in power IC is provided. In addition, discrete Schottky diode can also be fabricated based on this invention.

REFERENCES

[1] X. B. CHEN, U.S. Pat. No. 5,726,469, "Surface Voltage Sustaining Structure for Semiconductor Devices" Mar. 10, 1998.
[2] X. B. CHEN, U.S. Pat. No. 6,310,365 B1, "Surface Voltage Sustaining Structure for Semiconductor Devices Having Floating Voltage Terminal" Oct. 30, 2001.
[3] X. B. CHEN, U.S. Pat. No. 6,998,681 B2, "Lateral low-side and high-side high-voltage devices" Feb. 14, 2006.

DETAILED DESCRIPTION OF THE INVENTION

Figure 2:
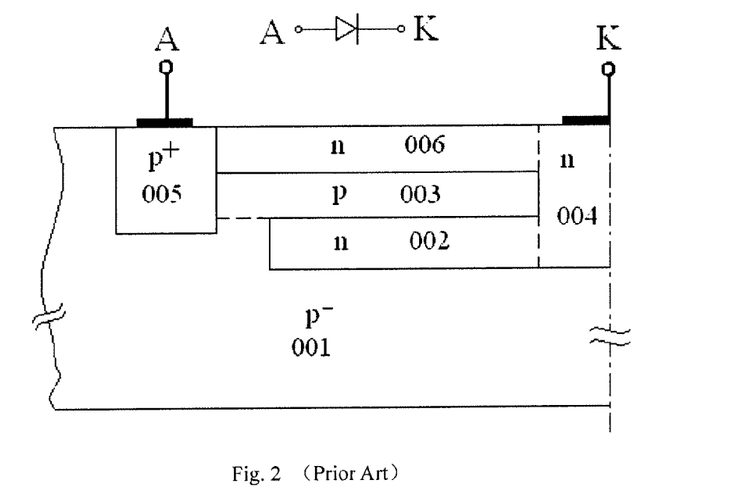
FIG. 2 schematically shows a cross section view of a device unit of a lateral high-voltage diode (interdigitated). (Prior art)

FIG. 2 shows a bipolar diode using the technology in [1]. The top part of the figure shows the circuit symbol of the diode. The part under the circuit symbol shows the cross section view of the diode structure. In a region under the surface of the p⁻-type substrate 001, there is a surface voltage sustaining region from the cathode K to the anode A, which is composed of the n-type semiconductor 002 of the buried layer, the n-type layer 006 on top and the p-type semiconductor 003 in the middle. When the applied reverse voltage across the two electrodes, A and K, approaches the breakdown voltage, regions in n⁺-region 004 and p⁺-region 005 are not fully depleted. However, region 002 is fully depleted and the flux density per area produced by region 002 varies from 2 $qD_0$ starting from the rightmost part to $qD_0$, at the leftmost part. Region 003 is also fully depleted, providing a uniformed negative electric flux density of around 2 $qD_0$. Besides, region 006 is also fully depleted, providing a positive electric flux density of around 1 $qD_0$. Where $qD_0=\epsilon_s E_c$, $\epsilon_s$ is the permittivity of the semiconductor, q is the electron charge, and $E_c$ is the critical electric field of breakdown. Said density is defined as the average value in a region with its dimension much smaller than that of the depletion width of a one-sided abrupt parallel-plane junction formed by the same substrate under its breakdown voltage, and much larger than the thickness of the region.

Figure 3:
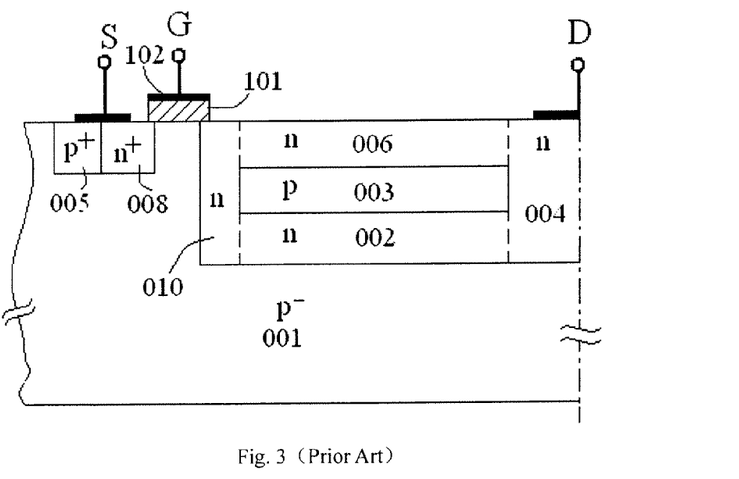
FIG. 3 schematically shows a cross section view of a device unit of a lateral n-MOST according to [1]. (Prior art)

FIG. 3 shows an application of implementing lateral power MOST by using the structure of the surface voltage sustaining shown in FIG. 2. In this figure, S, G, and D stand for the source electrode, the gate electrode and the drain electrode of the n-MOST, respectively. Electrode S is contacted to the source n⁺-type region 008 and source-body contact region (p⁺-type region 005), via an ohmic contact (the solid bold line). Electrode G is connected to the conductive region of the gate 102; gate insulator layer 101 is formed under the conductive region of the gate 102; the conductive region of the gate 102 covers part of surface of 008, part of the surface of 001 and the surface of a narrow n-type region 010. The voltage sustaining region 006 is connected to 002 via 010 underneath the gate, because they are drift regions at an "on" state, and with this connection they are channels through which electrons can reach to the drain electrode D.

Figure 4:
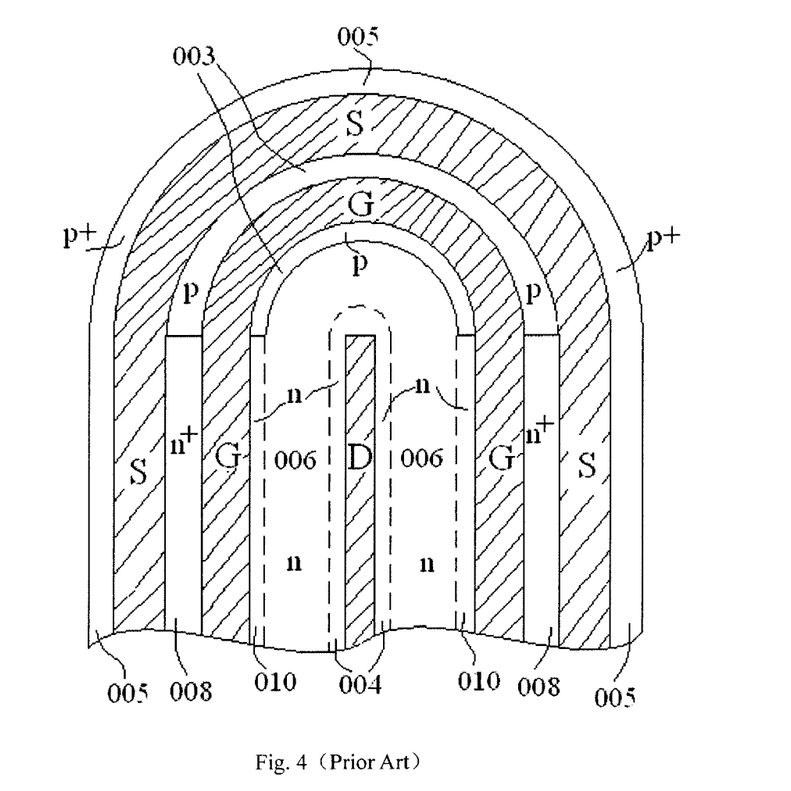
FIG. 4 schematically shows a top view of the structure in FIG. 3 where at the finger end of interdigitated layout p-type region is connected to the substrate and not used to form the active region of n-MOST. (Prior art)

All devices in FIG. 2 and FIG. 3 and in present invention are lateral devices (also called as surface devices), belonging to interdigitated configuration. FIG. 4 shows a top view of the structure in FIG. 3. The shadow region represents the contact region of electrodes S, G and D. It should be noted that no n-type region is formed at the finger end so that a p-type region 003 is connected to the substrate here. Of course, such a connection can also be formed via some finger edges of interdigitated layout instead of at finger end. Besides, no such a connection is also allowed, in that case, the on/off speed may be reduced a little.

Figure 5A:
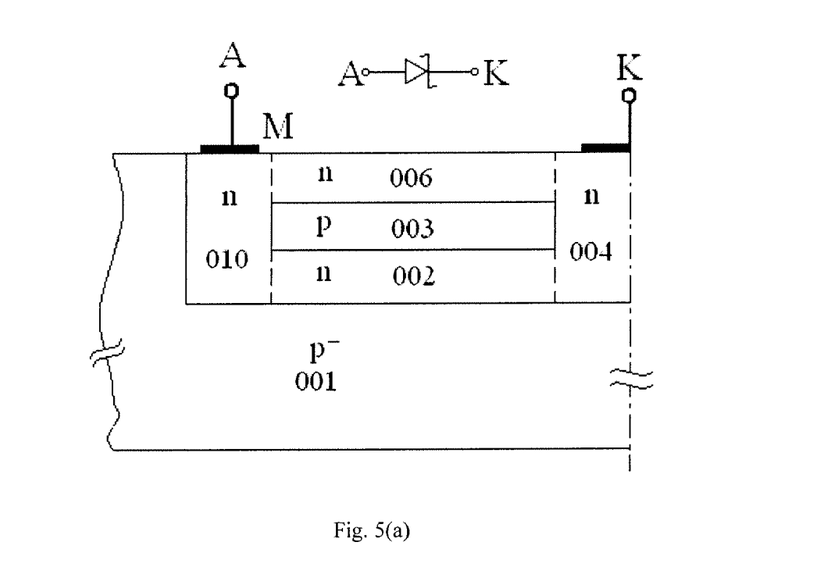
FIG. 5(a) schematically shows a cross section view of the Schottky diode in present invention and its circuit symbol.

In this invention, in order to implement a Schottky diode by using the structure in FIG. 2, a method is provided as illustrated in FIG. 5(a). The top part of the figure is the circuit symbol of the device. The part under the symbol shows the cross section view of the device structure.

Figure 5B:
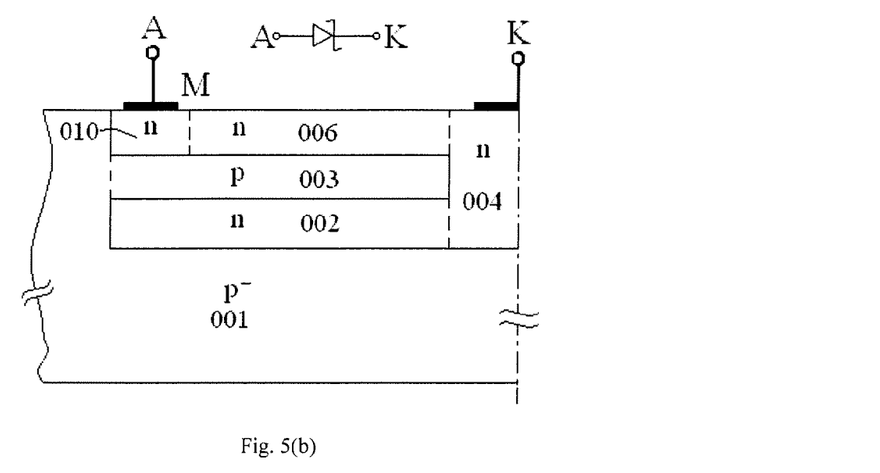
FIG. 5(b) schematically shows a cross section view of a structure where the p-type region in the voltage sustaining region of the Schottky diode in FIG. 5(a) is directly connected to the substrate.

In FIG. 5(a), symbol M represents the metal in the metal-semiconductor contact of the Schottky diode. The metal is the same with that used in a common Schottky diode. It can even be formed by the metal used for electrode, for instance, aluminium. However, the contact should not be an ohmic contact. That means the concentration of the donor in the n-type region in contact with the metal on top should be low enough instead of a heavily doped one. P-type region 003 in this figure can be connected to the substrate 001 via some parts of interdigitated layout and also can be connected to the substrate at the finger ends of interdigitated layout as shown in FIG. 4. In addition, the p-type region 003 can be formed as shown in FIG. 5(a) and also can be formed as shown in FIG. 5(b). As shown in FIG. 5(b), region 010 is not connected to region 002.

Under a reverse bias, high electric field may occur at the edge of metal M. For this, p-type region 007 and 009 can be formed at the edges of the metal as shown in FIG. 5(c).

Figure 5C:
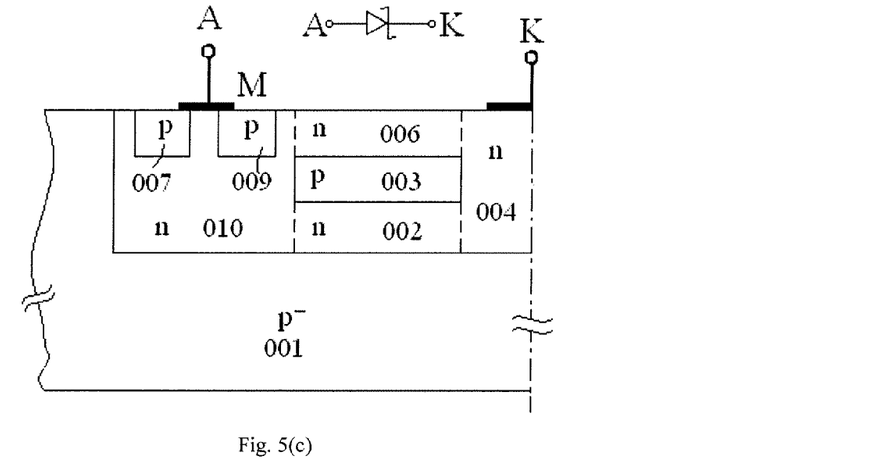
FIG. 5(c) schematically shows a situation that the edges of metal of the Schottky diode in FIG. 5(a) is connected to a p-type region.

FIG. 5 shows an example of implementing Schottky diode by using a p⁻-type substrate. By using the method in [2] to realize high-side and low-side voltage sustaining structures, it should also not be difficult to implement low-side high-voltage Schottky diode and high-side high-voltage Schottky diode by the methods illustrated in FIG. 5. The methods of how to implement high-side and low-side Schottky diodes $D_2$ and $D_1$ by using an n"-type substrate are presented as follows.

Figure 6:
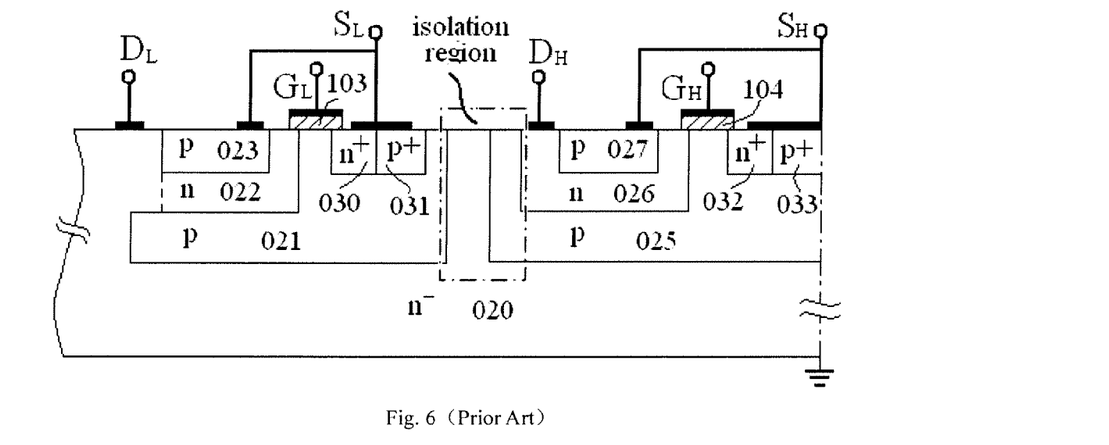
FIG. 6 schematically shows a cross section view of a lateral high-side and a lateral low-side power devices according to [3]. (Prior art)

FIG. 6 shows the cross section view of high-side and low-side n-MOST according to Ref. [3]. The labels H and L represent high-side and low-side, respectively. Underneath the high-side and low-side gates $G_H$ and $G_L$, there are gate isolation layers 104 and 103, respectively. In this figure, n"-type region 020 is the substrate; p-type regions 021 and 025 are low-side and high-side surface voltage sustaining regions of a second conductivity type in contact with the substrate, respectively. Where n-type regions 022 and 026 are the drift regions of the two voltage sustaining regions; p-type regions 023 and 027 are the impurity compensation regions in top regions of the low-side and high-side voltage sustaining regions, respectively. n⁺-type regions 030 and 032 are source regions of low-side and high-side MOST, and p⁺-type regions 031 and 033 are contact regions of the source-body regions of low-side and high-side n-MOST, respectively.

The block of dashed-dot line in FIG. 6 shows an isolation region between the two floating regions connected to the two different voltage sustaining region, respectively. This isolation region is for preventing the carrier flows between the high side and the low side device.

Figure 7:
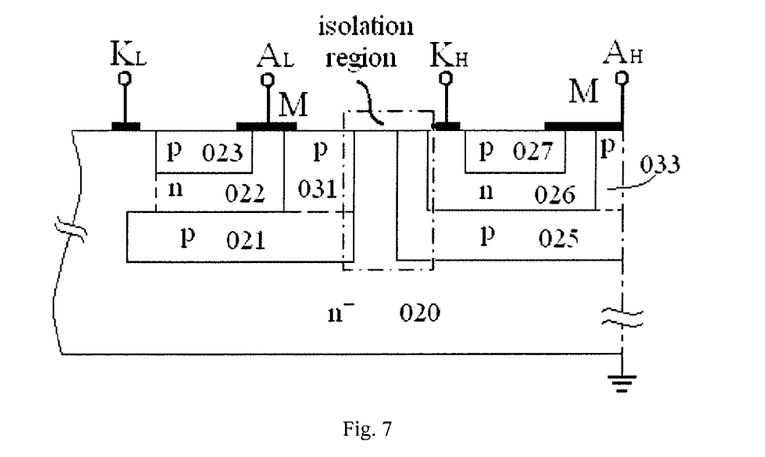
FIG. 7 schematically shows a cross section view of the device in present invention based on the structure in FIG. 6 that can be used for high-side and low-side Schottky diodes.

It is easy to realize high-side and low-side Schottky diodes based on the voltage sustaining structure in FIG. 6 as shown in FIG. 7. In FIG. 7, the Schottky junctions are formed by the metal M on n-type region 022, and metal M on n-type region 026, respectively. In this figure, the metal M on the left side is also contacted to the p-type region 023 and p-type region 031 and the metal M on the right side is also contacted to the p-type region 027 and p-type region 033. In this way, not only Schottky diodes are formed, but also p-type region in the most surface portion is connected to the p-type region which sustains the largest voltage, which is a negative value, and thereby the additional connection at the finger end of interdigitated layout shown in FIG. 4 is saved.

The block of dashed-dot line in FIG. 7 shows an isolation region between the two floating regions connected to the two different voltage sustaining region, respectively, which has the same function as that in FIG. 6. In the following Figures, such isolation region is always necessary and the illustration of which will not state repeatedly.

Figure 8:
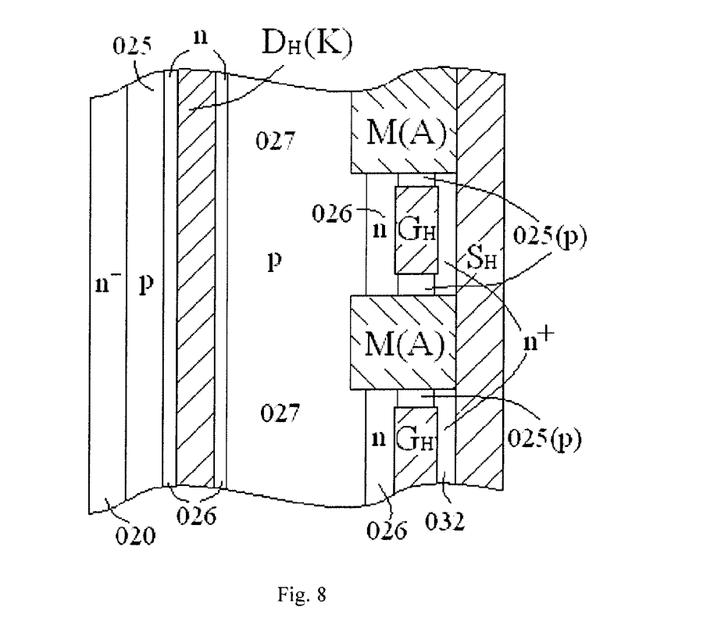
FIG. 8 schematically shows the top view of a structure where part(s) of metal-semiconductor contact of the high-side Schottky diode in FIG. 7 is replaced by the active region of an n-MOST.

Another advantage by using the above method is that Schottky diode and lateral power MOST can be realized in different parts in a same interdigitated layout. FIG. 8 shows the top view of arrangement of parts. The parts of shaded regions on the right side are the source electrode $S_H$, the gate electrode $G_H$ of the high-side n-MOST, and the anode of the Schottky diode A, where A is also a metal M for forming Schottky junction. The part of shaded regions on the left side is the drain electrode $D_H$ of high-side n-MOST, which is also the cathode K of the Schottky diode.

The on-resistance of a power MOST in FIG. 6 is composed of three parts: 1) the on-resistance of drift region 022 or the on-resistance of drift region 026, 2) the on-resistance of the active region of MOST, namely the on-resistance of the inversion layer under the gate $G_L$ or $G_H$, and 3) the spreading resistance from the end of the gate close to the drift region to the drift region. In a high-voltage MOST, the first term is much larger than the other terms. Therefore, in the direction perpendicular to the paper, if the width of the gate is smaller than the total width of interdigitated layout, say, half of the total width, then, the total on-resistance will not be much changed. On the other hand, although the on-resistance of a Schottky diode also includes the resistance of the drift region and the spreading resistance, the resistance of the drift region plays a major role. Also, note that Schottky diode is only turned-on when the power MOST is turned-off. Therefore, the on-resistance should not be much increased even though the Schottky diode and the MOST share one drift region. By using this method, the chip area can be saved, leading to a reduction of fabrication cost.

If the current density is too high, said above Schottky diode may show bipolar effect, which can be illustrated by FIG. 7. When the electron current density in the Schottky diode is too high, a voltage drop developed along the drift region 022 or region 026 can make the potential of the drift region at a place close to K lower than that potential of the p-type region underneath the drift region or of the p-type region above the drift region, then, the p-n junction is forward biased. When the forward bias reaches a certain level, then the p-n junction can inject minority carrier. Furthermore, since the buried layer 021 or 025 to the substrate is reverse biased and thereupon acts as a collector junction, and thus parasitic bipolar transistor effect can be formed. Assuming that the voltage dropped on the metal-semiconductor contact of Schottky diode is 0.4V, and voltage dropped on the forward p-n junction is 0.7V, the allowable voltage dropped on the drift region is only 0.3V.

In order to avoid bipolar effect stated above, a method of implementing many sectional Schottky diodes and making them in series connection is provided in this invention. The method is to divide a voltage sustaining region into two or more sections with each section having a comparatively short distance and maintaining the requirement of the impurity density distribution as a whole for a voltage sustaining region. The voltage to be sustained can still be very high. Besides, be eliminated.

Figure 9A:
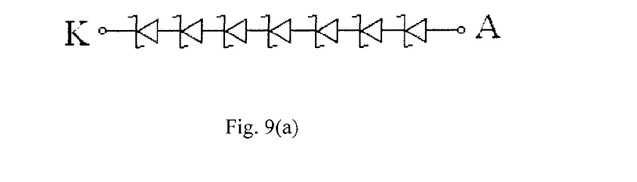
FIG. 9(a) schematically shows seven Schottky diodes in series connection.
Figure 9B:
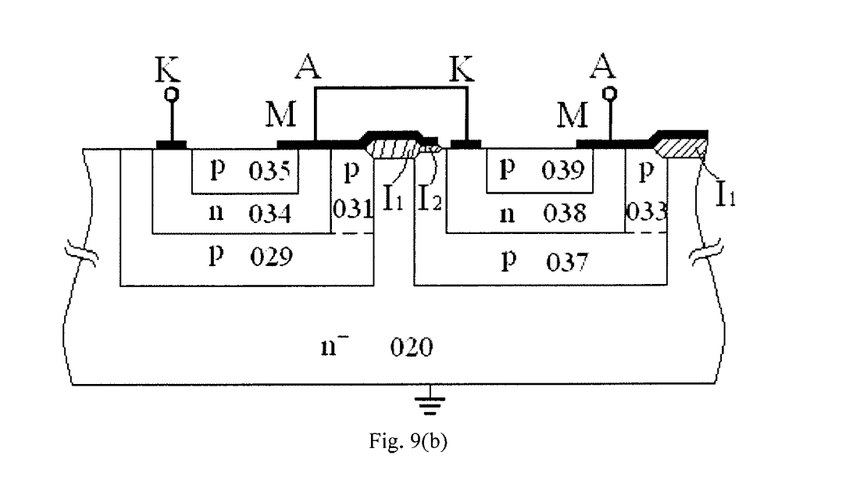
FIG. 9(b) schematically shows a cross section view of two of Schottky diodes in FIG. 9(a).

The method of such a division is schematically shown in FIG. 9. FIG. 9(a) shows the circuit symbol of seven diodes in series connection. FIG. 9(b) shows the cross section view of two neighbouring sections of Schottky diode in the second voltage sustaining region. Section 1 locates in the portion having the largest voltage under the reverse voltage. In this figure, it is assumed that both sections have a uniformed impurity density. In the right section, the impurity densities of region 039, 038, 037 are $1D_0$, $1.8D_0$ and $1.6D_0$, respectively, thus leading to an effective impurity density of $0.8D_0$ of a second conductivity type in the section. In the left section, the impurity densities of region 035, 034, 029 are $1D_0$, $1.8D_0$ and $1.4D_0$, respectively, thus leading to an effective impurity density of $0.6D_0$ of a second conductivity type in the section.

In order to achieve good isolation between two voltage sustaining regions, metal M on the left side of this figure can be extended onto a comparatively thick isolation layer $I_1$ (e.g. by forming a field oxide layer there), and further be extended onto a comparatively thin isolation layer $I_2$ (e.g. by forming a gate oxide). The comparatively thin isolation layer forms a capacitor between the metal M on the left and the p-type region 037, making the potential of the left side of p-type region 037 close to that of p-type region 031, and thus leading to a good isolation.

Note that such method of isolation can also be applied to FIG. 6, FIG. 7 or whatever an isolation of carrier flow is needed.

Actually, since the isolation region between two neighbouring sections can also sustain a certain voltage, it is not necessary that the impurity density distribution of the sections meets exactly the overall requirement of each voltage sustaining region. For example, the impurity densities of region 029 and 037 are both equal to $1.8D_0$; the impurity densities of region 034 and 038 are both equal to $1.81)_6$ and the impurity densities of region 035 and 039 are both equal to $1D_0$. Each diode can sustain 90V and seven of them can sustain 630V. Although in comparison with one Schottky diode sustaining 630V, more forward voltage are dropped on the six metal-semiconductor contacts (each about 0.4V), the minority carrier effect is eliminated.

Figure 10A:
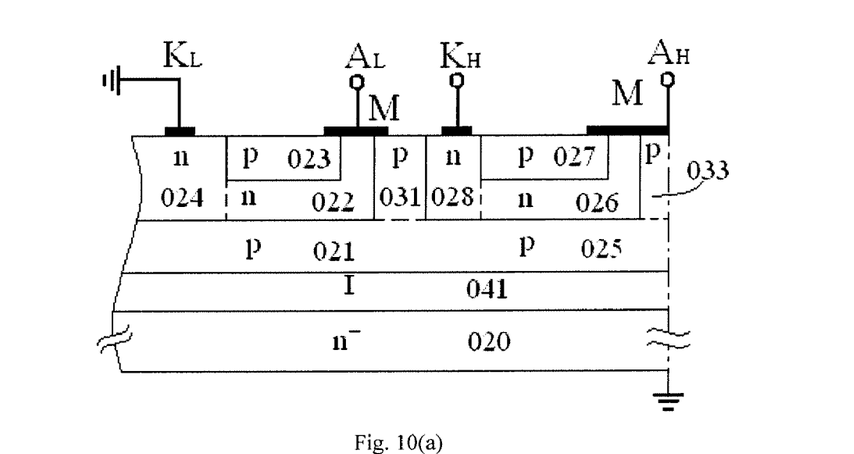
FIG. 10(a) schematically shows a situation that a thin isolation layer is formed between the surface voltage sustaining region and the substrate.

As the lateral high reverse voltage Schottky diode in this invention is only related to the surface voltage sustaining region, it has been described in [3] that the lateral devices are not affected if a thin insulator layer is formed between the surface voltage sustaining region and the substrate. The structure is shown in FIG. 10(a), where the layer I, 041, is the thin insulator layer, which may be an oxide layer or other insulators. There is an additional advantage by using the insulator layer, that is, the parasitic bipolar effect that occurs between the device and the substrate can be avoided. In this figure, n-type regions 024 and 028 are contact regions used for connection to drift region in the high-side and low-side devices, respectively.

Figure 10B:
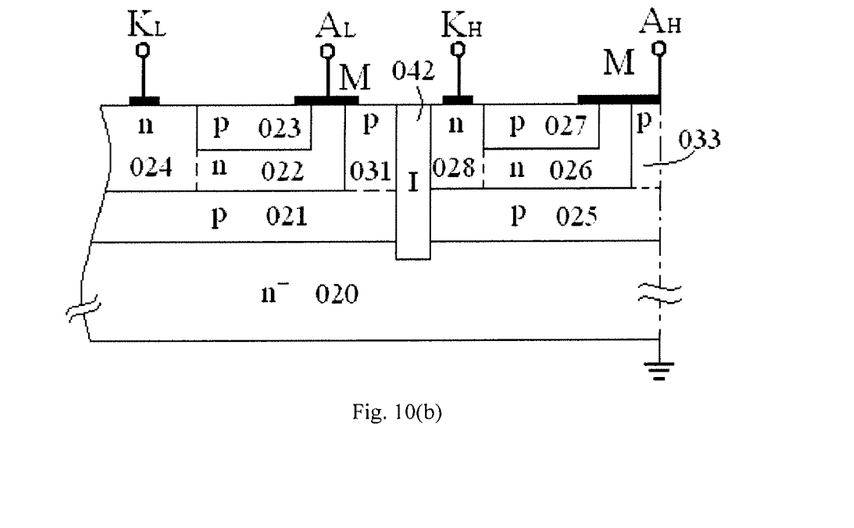
FIG. 10(b) shows a situation that an isolation region is formed between two surface voltage sustaining regions.
Figure 10C:
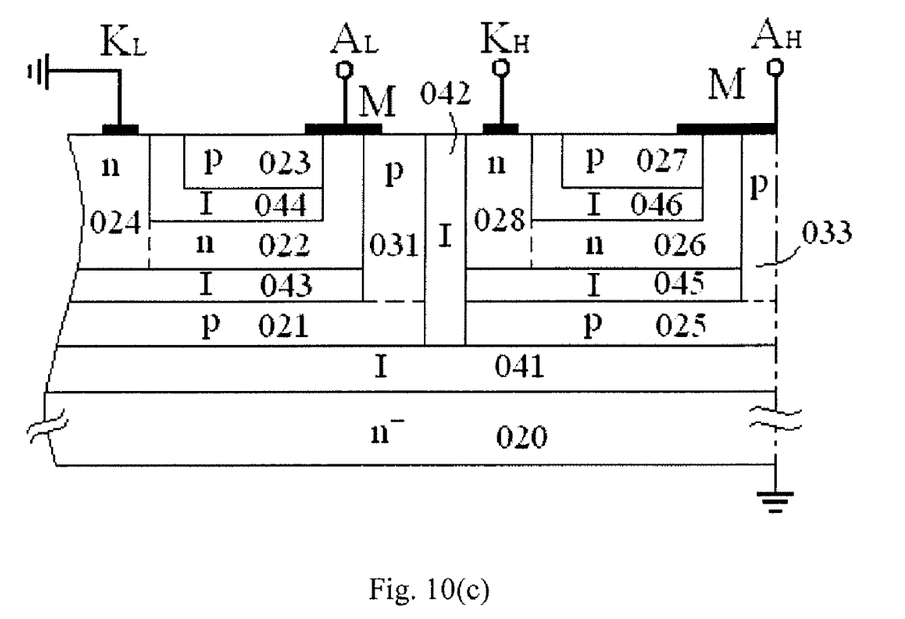
FIG. 10(c) shows a situation that an insulator region is formed between two regions of different conductivity types located within one surface voltage sustaining region.

Also, as described in [3], the properties of the voltage sustaining regions are not affected when an insulator layer is inserted between them. On the contrary, it makes isolation be better. FIG. 10(b) shows one structure, where layer 042 is the insulator region. FIG. 10(c) schematically shows another structure, where thin insulator layers are inserted between semiconductor layers of different conductivity types, namely, layers 043, 044, 045 and 046. In this situation, above mentioned bipolar effect caused by the forward biased p-n junction not occurs at all.

What is claimed is:

1. A semiconductor lateral device formed on a surface of a lightly-doped semiconductor substrate of a first conductivity type comprising at least one Schottky diode of a first kind and/or at least one Schottky diode of a second kind;

wherein said Schottky diode of a first kind comprises at least a zero voltage region with the same potential as that of the substrate, a first floating voltage region with a voltage variable from zero to a largest reverse bias voltage, and a first voltage sustaining region between said zero voltage region so and said first floating voltage region;

wherein said Schottky diode of a second kind comprises at least a second floating voltage region with a voltage variable from a largest reverse bias voltage to zero, a largest voltage region and a second voltage sustaining region in the surface between said second floating voltage region and said largest voltage region;

wherein said substrate is defined as having smallest voltage and is taken as the reference of potential; when the first conductivity type is p-type and the second conductivity type is n-type, the value of said largest voltage is positive, each floating voltage region and said largest voltage region have positive potentials; when the first conductivity type is n-type and the second conductivity type is p-type, the value of said largest voltage is negative, each floating voltage region and said largest voltage region have negative potentials, being lower than that zero potential of said substrate;

wherein each of said two voltage sustaining regions comprises:

at least an n-type semiconductor layer, at least a layer of a second conductivity type contacted with the substrate and layers of different conductivity types arranged alternatively starting from said substrate to semiconductor surface;

wherein in each of said two voltage sustaining regions, a cathode region of each kind of Schottky diode is formed on top of a portion having the highest potential under a reverse bias; an anode region is formed on top of the portion having the lowest potential; said n-type semiconductor of said voltage sustaining region in both cathode region and anode region have two conductor layers be contacted with, said two conductor layers form cathode and anode of said Schottky diode; wherein said conductor on the portion having the lowest potential is metal, said metal and said n-type semiconductor region beneath said metal form Schottky junction; said metal is the anode of the Schottky diode;

said Schottky junction has a current flow from said metal to said n-type semiconductor region beneath said metal, when a positive voltage is applied from said metal to said n-type semiconductor region, said current in said n-type semiconductor region is mainly due to a flow of electrons;

said semiconductor layer of second conductivity type in contact directly with the substrate is contacted to the region having the largest voltage in the voltage sustaining region, and other semiconductor layers of second conductivity type are connected to the region having the largest voltage through a part of semiconductor of second conductivity type close to it, or through said metal forming Schottky junction;

wherein each semiconductor layer of a first conductivity type is at least partly contacted directly to the region having the smallest voltage at finger edges or at the finger ends of the interdigitated layout;

wherein the overall thickness of said surface voltage sustaining region should be less than that of depletion region of a one-sided abrupt parallel-plane junction made by the same substrate under a reverse bias close to the breakdown voltage;

wherein the semiconductor layer of a second conductivity type in contact with the substrate is defined as the first layer; the density of the impurity of said first layer can vary with distance but should be not larger than $2D_0$; for the second surface voltage sustaining region, the density of impurity of said first layer should be not smaller than $D_0$; where the density of the impurity is defined as the amount of effectively ionized impurity of a second conductivity type per area in the layer, $D_0$ is the impurity density of a second conductivity type in the depletion region of the heavily-doped side of a one-sided abrupt parallel-plane junction made by the same substrate under the largest reverse bias;

wherein at place(s) close to the largest voltage region, the value of impurity density of each layer of each voltage sustaining region should be not larger than $2D_0$, and at place(s) close to the smallest voltage region, the value of the impurity density should be not larger than $1.8D_0$;

wherein the overall effective impurity density, being obtained by subtracting the sum of the effective impurity density of layers of a first conductivity type from the sum of the effective impurity density of layers of a second conductivity type, decreases gradually or stepwisely with the increase of the distance from the portion having the largest voltage in the voltage sustaining region, and approaches zero at the portion having the smallest voltage region;

wherein said impurity density is obtained by dividing the sum of the number of ionized impurity in a surface area, said surface area has dimensions in any direction much smaller than the thickness of the depletion region of a one-sided abrupt parallel-plane junction made by the same substrate under a largest reverse bias;

when the voltage of the largest voltage region approaches that of the smallest voltage region, except first layer of said voltage sustaining region, each layer has only a small part corresponding to the built-in potential being depleted.

2. The semiconductor lateral device according to claim 1, wherein an insulator layer is formed between the substrate and lateral interdigitated Schottky diode and/or between every two layers of the surface voltage sustaining region.

3. The semiconductor lateral device according to claim 1 comprises at least one Schottky diode of a first kind and at least one Schottky diode of a second kind; wherein the voltage difference between said first floating voltage region and said second floating voltage region is smaller than said largest reverse bias voltage and an insulator layer is formed between the first voltage sustaining region and the second voltage sustaining region.

4. The semiconductor lateral device according to claim 1 comprises at least one Schottky diode of a first kind and at least one Schottky diode of a second kind; wherein the voltage difference between said first floating voltage region and said second floating voltage region is smaller than said largest reverse bias voltage and an isolation region for carriers is located from said first floating voltage region of said Schottky diode of first kind to said second floating voltage region of Schottky diode of second kind; said isolation region for carriers has a surface distance, said distance is smaller than the thickness of the depletion region of a one-sided abrupt parallel-plane junction made by the same substrate under a largest reverse bias.

5. The semiconductor lateral device according to claim 1, wherein said voltage sustaining region(s) of Schottky diode of first kind and/or second kind is divided into at least two sections and an isolation region is inserted between two neighbouring sections;

wherein each section forms a sectional Schottky diode;

under a reverse bias applied across each section, a cathode region of a sectional Schottky diode is formed on top of the portion having the highest potential and an anode region of a sectional Schottky diode is formed on top of the portion having the lowest potential, wherein two conductor layers contacted to said n-type semiconductor layer at said anode region and at said cathode region, forming anode electrode and cathode electrode of a sectional Schottky diode;

wherein said conductor layer located at portion of lowest potential is a metal, said metal is anode and forming Schottky junction with portion of said n-type semiconductor layer beneath said metal;

wherein said conductor layer located at portion of highest potential is cathode;

said sectional Schottky diodes of one kind Schottky diode are in a series so connection according to a sequence before said division into sections of voltage sustaining region.

6. The semiconductor lateral device according to claim 1 or claim 5, wherein an isolation region between neighbouring surface voltage sustaining regions or neighbouring sections located from a larger voltage portion to a smaller voltage portion under a reverse bias is started from a semiconductor region of a second conductivity type, and then through a semiconductor region of a first conductivity type contacted with the substrate;

wherein in said isolation region, a thick insulator layer formed on top of said semiconductor region of a first conductivity type contacted with the substrate is permitted;

wherein a thin insulator layer formed on top of semiconductor region of a second conductivity type of said isolation region is permitted;

wherein a conductor with one part covering on said isolation layer and another part directly contacted to the top of said smaller voltage portion of surface voltage sustaining region or to the top of said smaller voltage portion of a section is permitted.

7. The semiconductor lateral device according to claim 1 or claim 5, wherein edges of said metal of said Schottky junction is contacted to p-type semiconductor.

8. The semiconductor lateral device according to claim 1, or claim 2, or claim 3, or claim 4, wherein said Schottky diode of one kind is connected in parallel with an n-MOST, wherein Schottky junction is formed by depositing metal layer on top of some portions of n-type semiconductor region having the lowest potential, said metal layer also covers directly on p-type semiconductor regions neighbouring to n-type semiconductor region and on n-type semiconductor region inside p-type regions;

wherein an insulator layer covers on other n-type semiconductor region neighbouring to said metal layer, said insulator layer extends to covering p-type semiconductor regions neighbouring to n-type semiconductor region except portions having metal layer, said insulator layer even extends to covering an n-type semiconductor region inside p-type regions;

said insulator layer forms a gate insulator layer of said n-MOST; a gate electrode of said n-MOST is formed by depositing a conductor on top of said insulator layer; a source electrode of said n-MOST is the metal part of the Schottky junction; a drain electrode of said n-MOST is said cathode of the Schottky diode.

* * * * *